United States Patent [19]
Yokomizo et al.

[11] Patent Number: 5,503,171
[45] Date of Patent: Apr. 2, 1996

[54] SUBSTRATES-WASHING APPARATUS

[75] Inventors: Kenji Yokomizo, Oonojo; Chihaya Tashima, Kumamoto; Eiichi Mukai, Kurume; Yoshiyuki Honda, Saga; Naohiko Hamamura, Chikushino; Shinya Murakami, Kumamoto; Yasuhiro Chouno, Tosu, all of Japan

[73] Assignees: Tokyo Electron Limited; Tokyo Electron Kyushu Limited, both of Tokyo, Japan

[21] Appl. No.: 172,419

[22] Filed: Dec. 22, 1993

[30] Foreign Application Priority Data

Dec. 26, 1992 [JP] Japan ................................ 4-358224
Apr. 7, 1993 [JP] Japan ................................ 5-105037
May 26, 1993 [JP] Japan ................................ 5-147022

[51] Int. Cl.$^6$ ........................................................ B08B 3/04
[52] U.S. Cl. ............................................ 134/182; 134/902
[58] Field of Search ................................... 134/902, 182

[56] References Cited

U.S. PATENT DOCUMENTS 5,327,921  7/1994  Mokuo et al. ................. 134/902 X

FOREIGN PATENT DOCUMENTS

| 61632 | 4/1983 | Japan | 134/902 |
|---|---|---|---|
| 66333 | 4/1983 | Japan | 134/902 |
| 62-42372 | 9/1987 | Japan . | |
| 62-42374 | 9/1987 | Japan . | |
| 62-42373 | 9/1987 | Japan . | |
| 57624 | 3/1989 | Japan | 134/902 |
| 1-184926 | 7/1989 | Japan | 134/902 |
| 56321 | 2/1992 | Japan | 134/902 |
| 5-33819 | 5/1993 | Japan . | |

*Primary Examiner*—Philip R. Coe
*Attorney, Agent, or Firm*—Graham & James

[57] ABSTRACT

A substrates-washing apparatus includes a process vessel in which washing solution is stored to wash a plurality of substrates, a boat for holding the substrates parallel to one another in the process vessel, solution supply openings formed in the bottom of the process vessel, a solution supply system communicated with the solution supply openings to supply washing solution into the process vessel through the solution supply openings, and a straightening plate arranged between the substrates held on the boat and the solution supply openings in the bottom of the process vessel and provided with a plurality of apertures through which washing solution passes. The apertures form plural lines in the longitudinal direction of the straightening plate, the apertures in each line are arranged to correspond to the substrates alternately, and the apertures in one line are shifted from those in the other adjacent line.

18 Claims, 16 Drawing Sheets

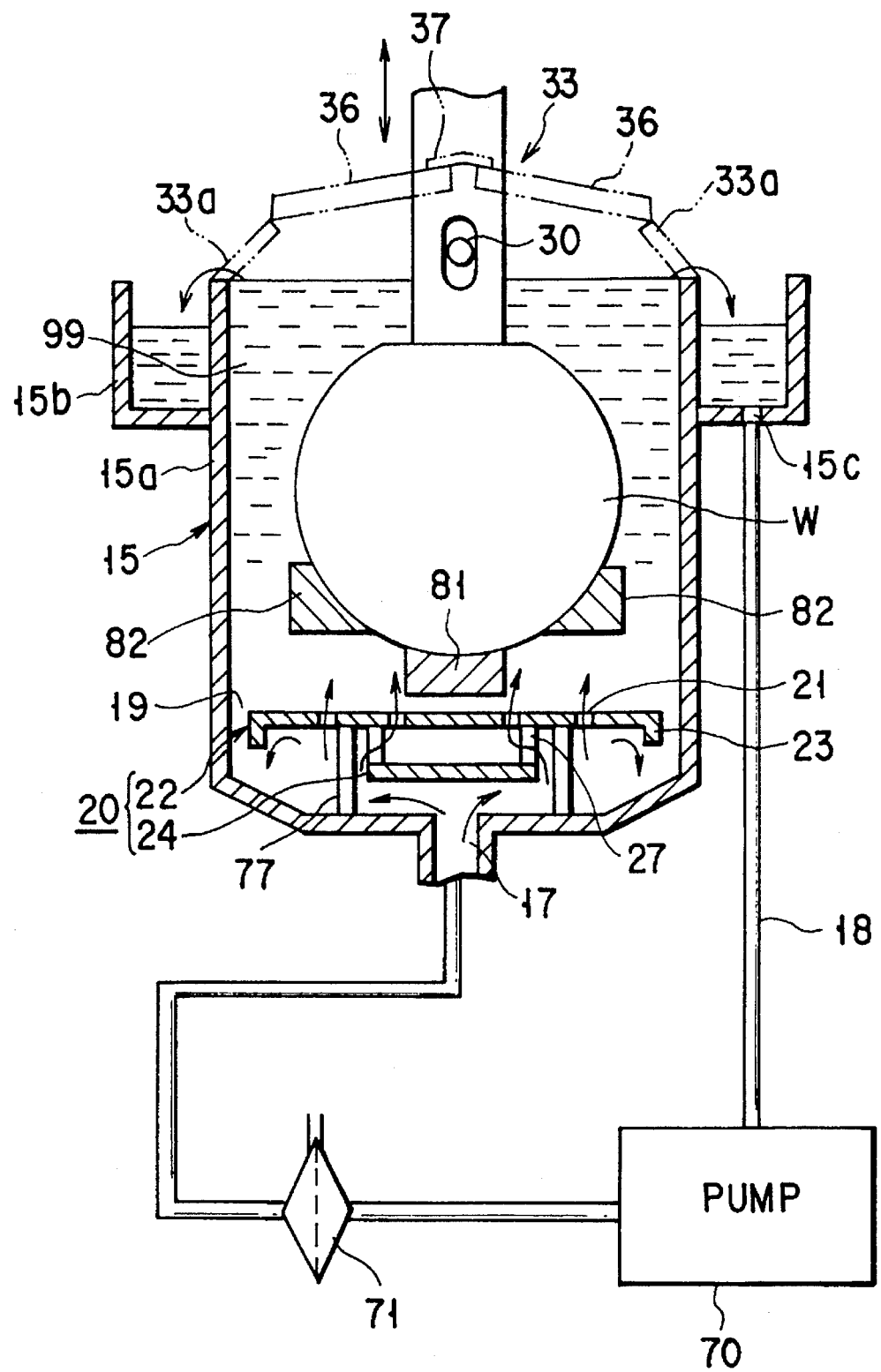
F I G. 3

SUBSTRATES-WASHING APPARATUS

BACKGROUND OF THE INVENTION

1. Field of the Invention

The present invention relates to an apparatus for washing substrates such as semiconductor wafers.

2. Description of the Related Art

The washing system has been used in the course of making semiconductor devices to remove particles, organic contaminating matters, metal impurities, naturally-formed oxide film and so on from surfaces of semiconductor wafers, for example. The washing system includes a plurality of substrates-washing apparatus and each of them includes a process vessel. The wafers are successively processed by ammonia, water fluoric acid, water, sulfuric acid, water, hydrochloric acid and water in these process vessels.

Each of the process vessels includes a wafer-holding boat and a straightening plate. A plurality of apertures are formed in lines in the straightening plate and the pitch interval of the apertures in one line is same. The boat can be carried into and out of the process vessel together with the wafers. When the wafers are immersed into washing solution in the process vessel, new washing solution is supplied into it through openings in its bottom to create a rising flow of washing solution in it. This rising flow of washing solution passes through the apertures in the straightening plate, contacts the wafers and overflows from the process vessel.

In the conventional apparatus, the pitch interval of the apertures in each line is same as that of the wafers held in the process vessel. As the wafers become larger in number, therefore, the number of the apertures in the straightening plate must be increased more and more. The straightening plate, however, is made of hard and breakable quartz. When the pitch interval of the apertures in each line becomes small, therefore, it is difficult to form the apertures in the straightening plate. When the diameter of each of the apertures is made small to meet this small pitch interval, the amount of washing solution passing through the apertures becomes insufficient and the time needed to wash the wafers is thus made long.

Further, the apertures are formed in all over the straightening plate in the conventional apparatus. However, those areas of the process vessel in which no wafer is present are quite larger than that area thereof in which the wafers are present, and washing solution flows more into the former areas but less into the latter area even though the apertures are formed in all over the straightening plate.

Jpn. Pat. Appln. KOKAI Publication No. Sho 58-61632 discloses a washing vessel provided with a straightening plate in which the apertures are formed to allow washing solution to fully flow to that area of the washing vessel which is remote from solution supply openings in the bottom of the vessel. Jpn. Pat. Appln. KOKOKU Application No. Sho 62-42374 also discloses a washing vessel wherein the diameter of each aperture in a first area of the straightening plate which corresponds to the center portion of the wafers is made large, the diameter of each apertures in second areas thereof which correspond to side portions of the wafers is made smaller than that of each aperture in the first area, and the diameter of each aperture in third areas thereof in which no wafer is present is made smaller than that of each aperture in the second areas.

In these straightening plates, however, the diameter of each aperture must be made different every time the area of the straightening plate in which the apertures are to be formed changes. This makes it troublesome to make the straightening plates. In addition, various kinds of apertures which are different in diameter must be formed in a large number in the straightening plate. The cost is thus made high.

Further, the circular wafers are carried into the rectangular vessel in the conventional substrates-washing apparatus. The volume of the washing vessel is therefore made so large as to create a dead space therein which does not contribute to washing the wafers.

Chemical solutions (such as hydrofluoric acid) are comparatively expensive. Any chemical solution overflowing from the washing vessel, therefore, is circulated. After it is contaminated to some extent, it is then exhausted as waste. When the volume of the washing vessel is large, the amount of this expensive chemical solution used is increased to thereby make the running cost high.

When the wafers which have have been processed by chemical solution are washed by pure water, this pure water introduced is not circulated but exhausted as waste at the time when it overflows from the vessel. The time needed to finish the washing of the wafers and the amount of pure water used in this manner are proportional to the volume of the washing vessel. The 8-inch wafers are recently used more and more instead of the 6-inch wafers and the washing vessel is thus made larger to meet these 8-inch wafers. It is therefore asked that a higher wafers-washing efficiency can be attained by a less amount of washing solution used.

SUMMARY OF THE INVENTION

An object of the present invention is therefore to provide a substrates-washing apparatus capable of achieving a higher substrates-washing efficiency by a less amount of washing solution used.

Another object of the present invention is to provide a substrates-washing apparatus smaller in volume and lower in cost.

According to an aspect of the present invention, there can be provided a substrates-washing apparatus comprising a process vessel in which a washing solution is stored to wash a plurality of substrates; means for holding the substrates parallel to one another in the process vessel; solution supply openings formed in the bottom of the process vessel; means communicated with the solution supply openings to supply the washing solution into the process vessel through the solution supply openings; and a straightening plate arranged between the group of the substrates held on the holder means and the solution supply openings in the bottom of the process vessel, and provided with a plurality of apertures through which the washing solution passes; wherein said apertures form plural lines in the longitudinal direction of the straightening plate, said apertures in each line are arranged to correspond to the substrates alternately, and said apertures in one line are shifted from those in the other adjacent line.

The apertures in each line are arranged in the straightening plate to correspond to the wafers alternately in the washing vessel. Washing solution passing through an aperture can rise, therefore, without interfering with washing solution passing through another adjacent aperture. When washing solution, thus rising, strikes against the substrate, it is divided to flow along one surface of the substrate and along the other surface thereof. Washing solution passing through the apertures in one line joins this time washing solution passing through the apertures in the other adjacent line between the substrates. The amount of washing solution supplied between the substrates can be thus made sufficient even if the pitch interval of the apertures in each line is set comparatively large.

Further, washing solution can be prevented from staying in the process vessel. In addition, the amount of washing solution flowing to an area in the process vessel which does not contribute to washing the substrates can be reduced. The amount of washing solution flowing only to another area in the process vessel which contributes to washing the substrates can be thus increased.

Still further, the first apertures are arranged in the straightening plate to correspond to the substrates alternately in the process vessel. This enables the first apertures to be made smaller in number and the diameter of each of them to be made larger than that of each of the second apertures.

Still further, the first apertures in one line are shifted from those in the other adjacent line. This enables washing solution to be fully supplied between the substrates through these first apertures in plural lines.

The diameter of each aperture in plural lines may be made same. Or the diameter of each aperture in one line may be made different from that of each aperture in the other line. When the diameter of each aperture is made different every line, it is desirable that the apertures in a line which is nearer to the substrates have a larger diameter. This enables a sufficient amount of washing solution to flow between the substrates.

It is desirable that the diffusing plate is arranged just above each of the solution supply openings. It is also desirable that each of the diffusing plates is provided with apertures. When apertures are formed in each of the diffusing plates, a sufficient amount of washing solution can flow more easily between the substrates.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a sectional view showing the flow of washing solution in a washing vessel of the substrates washing apparatus;

DETAILED DESCRIPTION OF THE PREFERRED EMBODIMENTS

Figure 1:
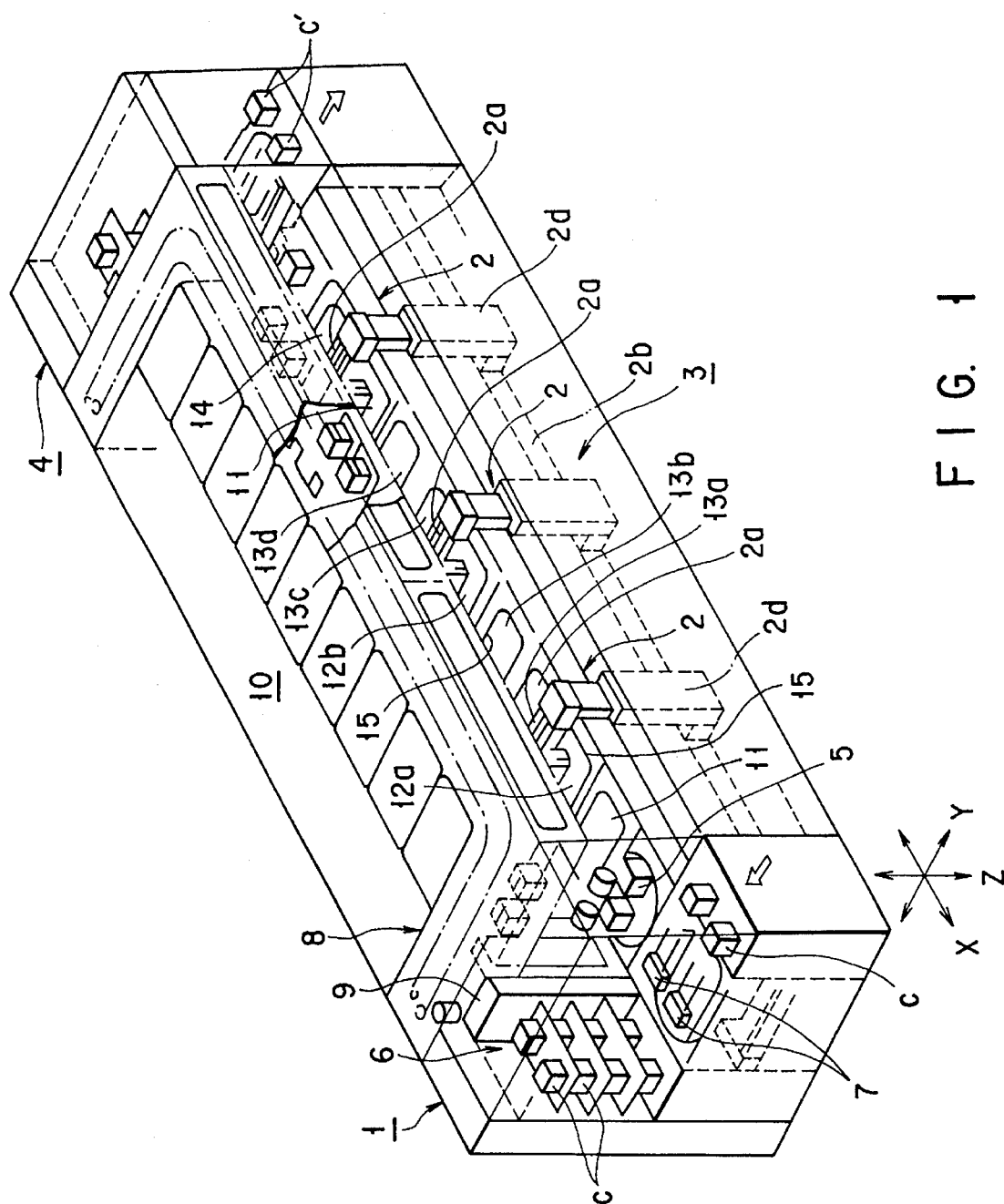
FIG. 1 is a perspective view schematically showing the whole of the washing system.

As shown in FIG. 1, the washing system comprises three main sections. The first is a carry-in section 1 where semiconductor wafers W which are to be washed are temporarily stored. The wafers W are carried into the washing system through the loader section 1. The second is a process section 3 where the wafers W are process with chemical and water solutions. The process section 3 includes three carrier robots 2, by which the wafers W are carried to each of process apparatus 11 to 15 in the process section 3. Each of the carrier robots 2 holds 50 sheets of wafers W as a unit by its wafer chuck 2a and carries them along a passage 2b. It is made movable along X, Y and Z axes. The third is a carry-out section where the wafers W which have been washed are temporarily stored. The wafers W are carried outside the washing system through the unloader section 4.

The carry-in section 1 includes a loader area 5, a waiting area 6 and cassettes carrier arms 7. Orientation flats of the wafers W are aligned with one another and the number of them are detected at the loader area 5. Plural wafer cassettes or carriers C are kept temporarily waiting at the waiting are 6. The cassette carrier arms 7 pick up the wafers W out of the cassettes C, carry the carried-in cassettes C to the waiting area 6, and transfer them between the waiting 6 and the loader area 5.

A cassettes-washing and -drying line 8 runs above and along the process section 3. Empty cassettes C are washed and dried while they are being carried along the cassettes-washing and -drying line 8. A solution tanks- and pipes-arranged area 10 is along the rear side of the process section 3.

The process section 3 includes a chuck-washing and -drying vessel 11, first and second chemical solution washing 12a, 12b, first and second water washing apparatus 13a, 13b, third and fourth water washing apparatus 13c, 13d and a drying vessel 14.

The second water washing apparatus 13b will be described as an example referring to FIGS. 2 to 12.

Figure 2:
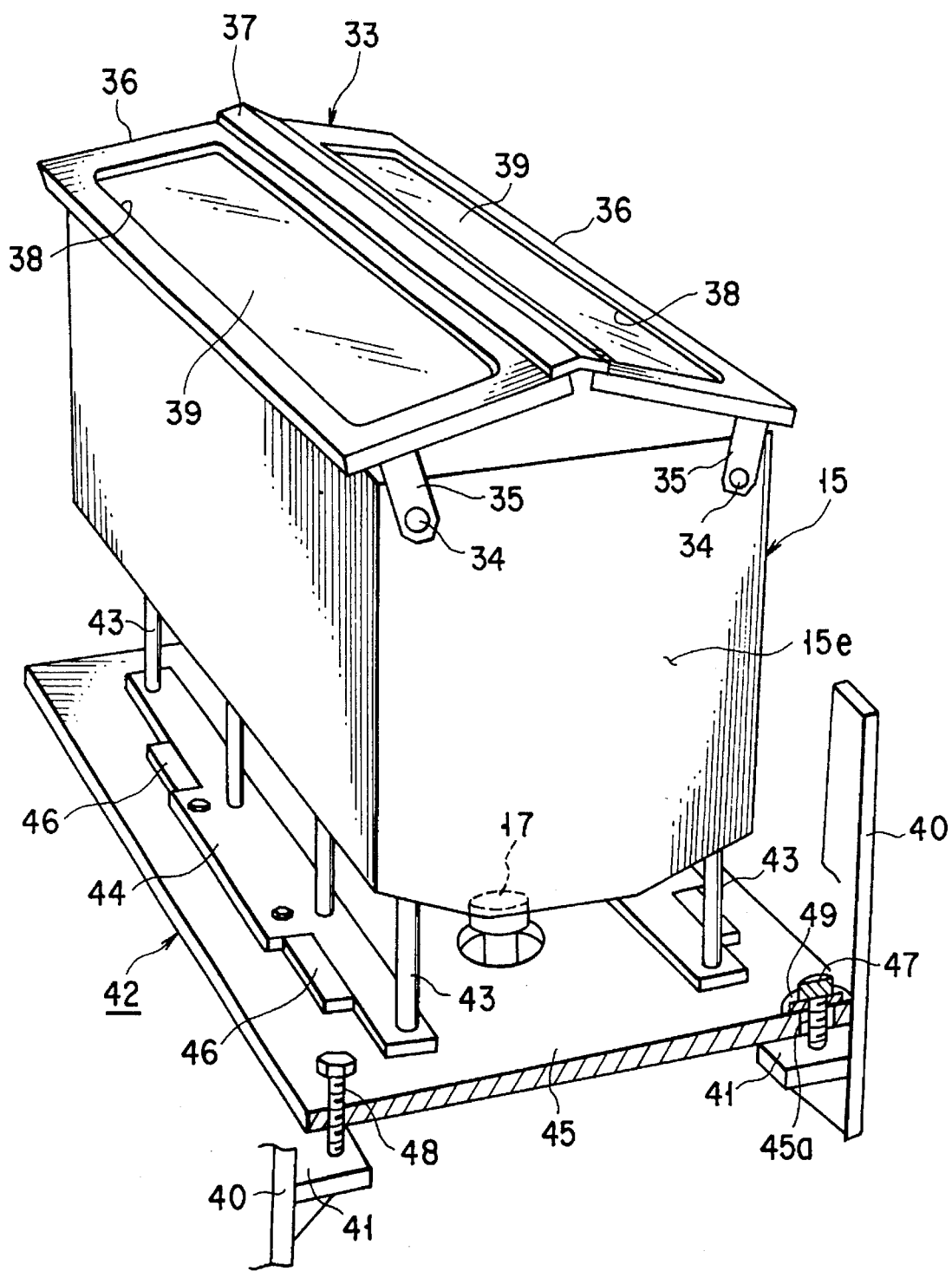
FIG. 2 is a perspective view showing the appearance of a substrates-washing apparatus.

As shown in FIG. 2, a process vessel 15 is arranged in the second water washing apparatus 13b and an openable lid 33 is on the open top of the vessel 15. It can be opened along its center line in the longitudinal direction and when it is opened in this manner, the wafers W can be carried in and out of the vessel 15. A lifter mechanism (not shown) for a boat 90 is arranged above the vessel 15.

The process vessel 15 includes a main vessel 15a and an overflow trough 15b. Two solution supply openings 17 are formed in the bottom of the main vessel 15a and they are communicated with the pump-out side of a pump 70 through a pipe 18. Pure water is thus supplied, as washing solution 99, into the main vessel 15a through the pipe 18 by the pump 70. The overflow trough 15b runs horizontally along outer four faces of the main vessel 15a at the upper portion thereof. A discharge opening 15c is formed in the bottom of the overflow trough 15b and it is communicated with the pump-in side of the pump 70. Washing solution 99 is circulated through a circulation circuit which comprises the main vessel 15a, the overflow trough 15b, the pipe 18, the pump 70 and a filter 71. Washing solution 99 overflowing from the main vessel 15a may be discharged outside as waste solution without circulating it through the above-mentioned circulation circuit.

Figure 4:
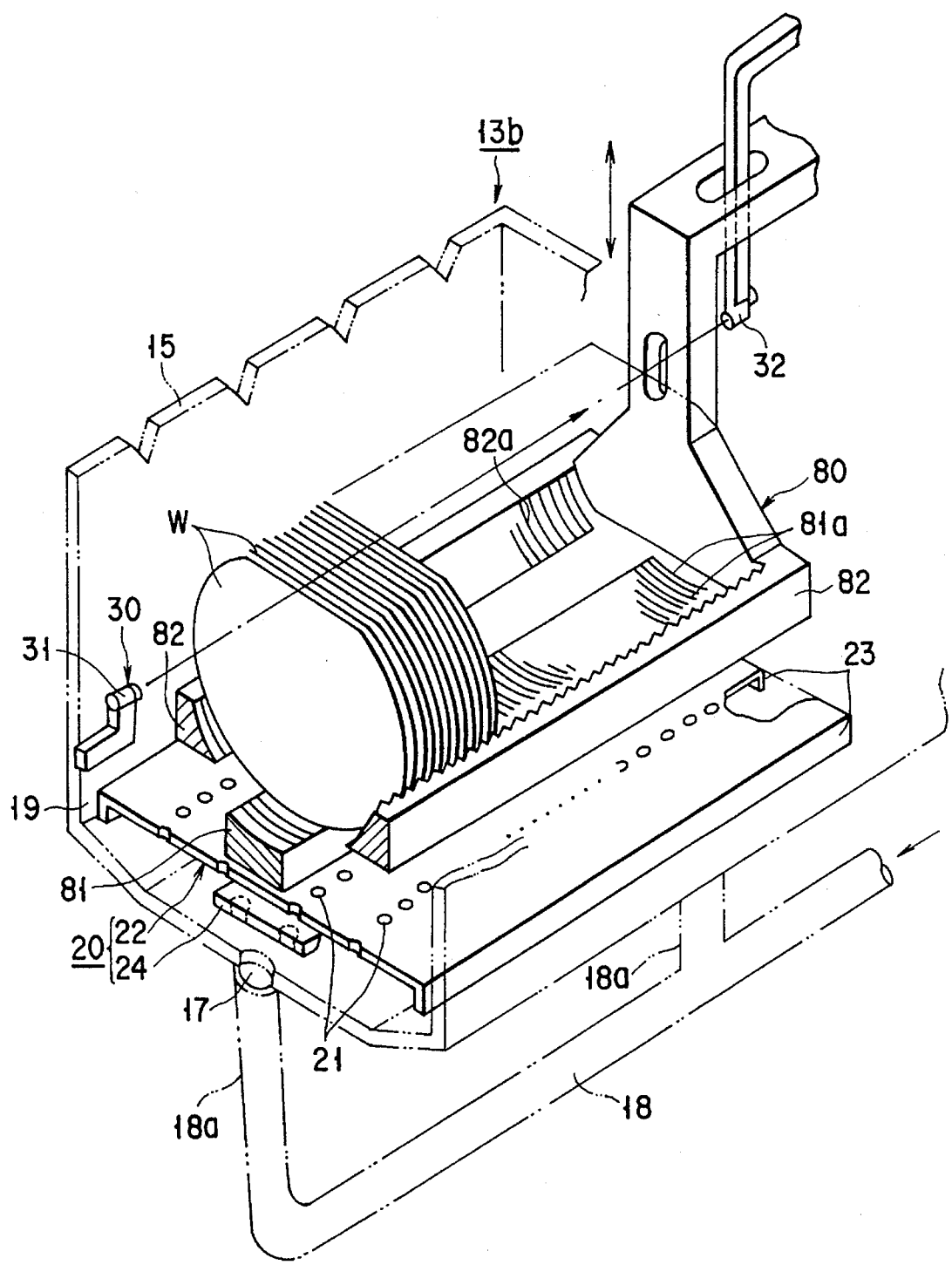
FIG. 4 is a perspective view showing the inside of the washing vessel in the substrates-washing apparatus.
Figure 6:
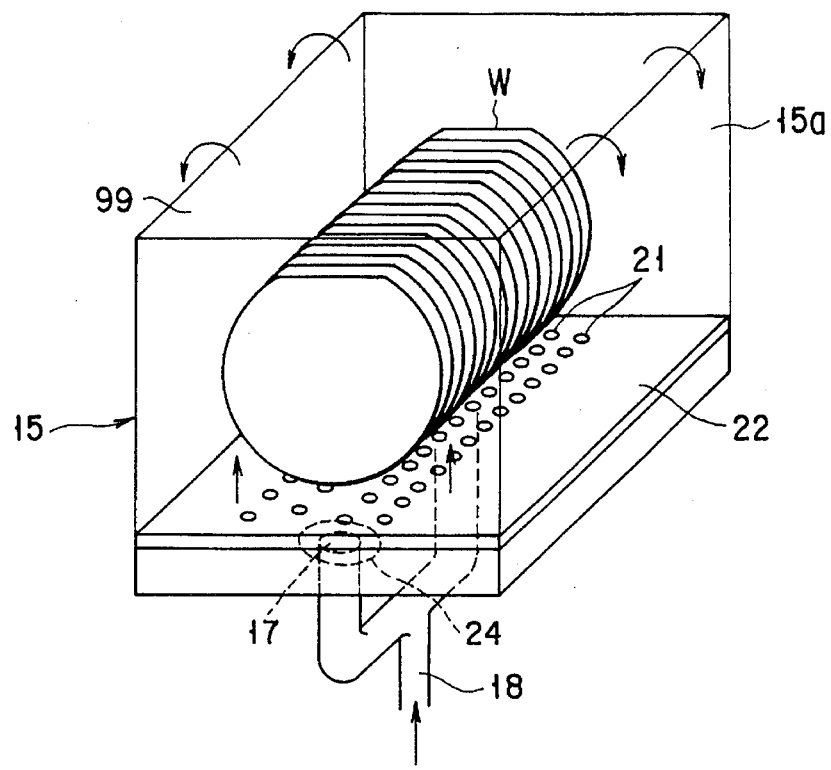
FIG. 6 is a perspective view showing the washing vessel as a type.

As shown in FIGS. 3, 4 and 6, a diffusing plate 24 is arranged just above the two supply openings 17 to diffuse washing solution 99 supplied. Further, a straightening plate 22 is arranged just above the diffusing plate 24. The wafers W are washed above this straightening plate 22. The diffusing and straightening plates 24 and 22 form a straightening means 20.

Figure 5:
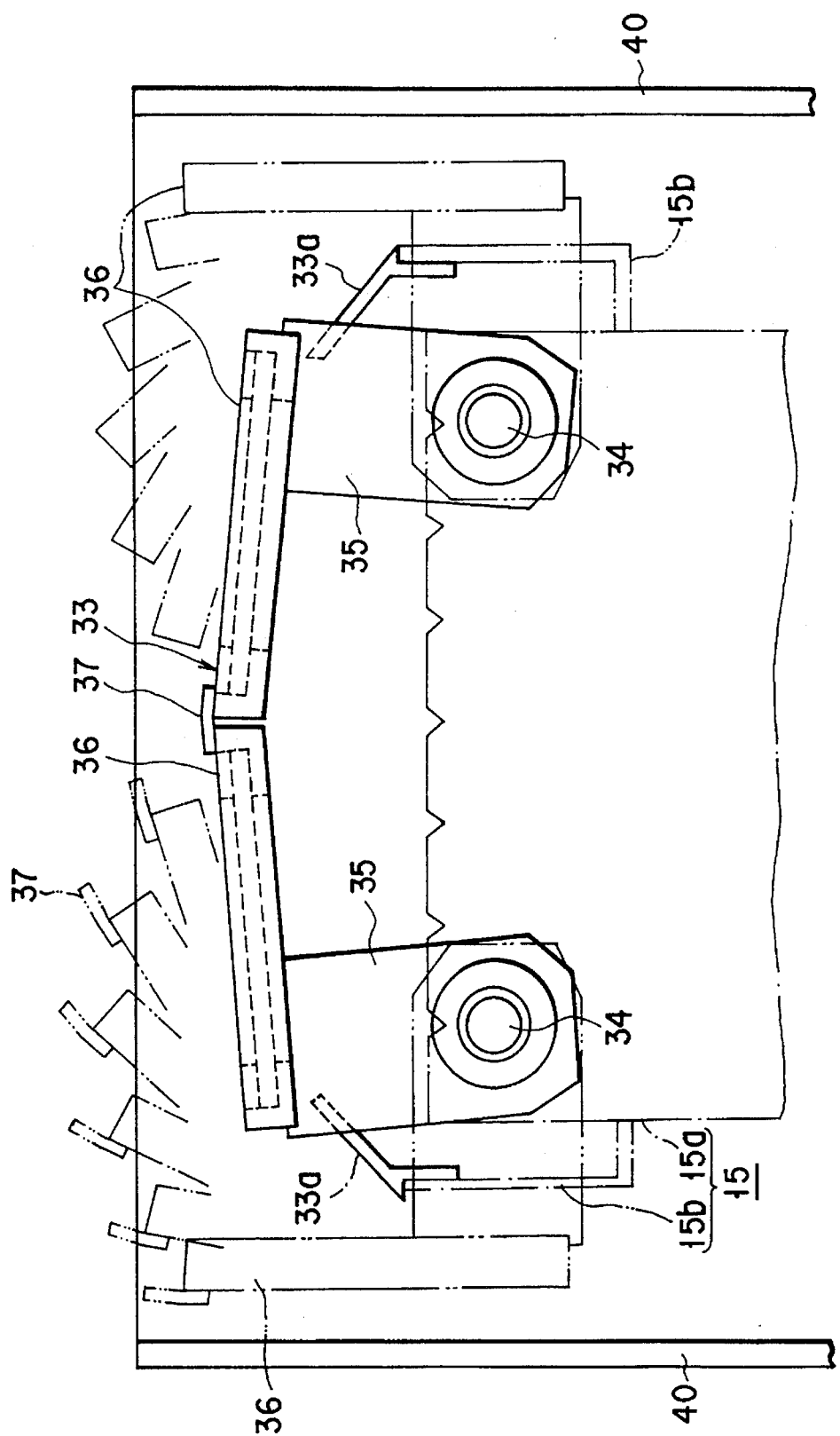
FIG. 5 shows a shutter on the top of the washing vessel enlarged.

As shown in FIG. 5, each of frames 36 of the lid 33 is supported by two shafts 34 through a pair of arms 35. A transparent plate 39 made of quartz is fitted into each of the frames 36 to enable the inside of the vessel 15 to be viewed through it. The four shafts 34 are attached to shorter side walls 15e of the process vessel 15. A cover member 37 is attached to one of the lid frames 36 to close a gap which is formed between the paired frames 36 when they are closed. The lid frames 36 are made of polytetra-fluoroethylene (PTFE). A tilted and fixed cover member 33a is arranged between each of the lid frames 36 and the overflow trough 15b to close a gap between them.

The shafts 34 are attached to the main vessel 15a at their one ends and to motor shafts (not shown) at their other ends. Two drive motors are controlled by controller (not shown) to start the opening of one lid frame 36 a little faster than that of the other lid frame 36. The lid 33 is shaped high at the center thereof but low at both sides thereof. Even if chemical solution adheres onto the lid 33, therefore, it flows down from high to low on the lid 33. This prevents it from crystalizing like particles on the lid 33. It also stays like solution drops on the transparent plates 39. It is therefore preferable that a discharge opening (not shown) is formed in the lower side frame portion of each window 38 and that chemical solution thus stayed on each transparent plate 39 is discharged outside through the discharge opening.

A level adjusting mechanism 42 will be described referring to FIG. 2.

The level adjusting mechanism 42 is arranged under the process vessel 15 to stably mount the process vessel 15 on mounts 41 of a main frame 40. It includes vessel-mounted plates 44, an adjuster plate 45, positioning blocks 46, fixing bolts 47 and adjuster plate bolts 48. The vessel-mounted plates 44 are ground at their under-sides and attached to lower ends of legs 43 which are fixed to the underside of the process vessel 15. The adjuster plate 45 is face-finished flat. One side of the adjuster plate 45 is fixed to the mount 41 of the main frame 40 by the fixing bolts 47, while the other side thereof is supported on the other mount 41 of the main frame 40 but jacked up by the adjuster plate bolts 48. The positioning plates 46 are fixed onto the adjuster plate 45. Each of through-holes 45a formed in the adjuster plate 45 has a diameter a little larger than that of the fixing bolt 47. Each fixing bolt 47 is passed through the through-hole 45a and fixed to the mount 41 via a spacer 49.

When the process vessel 15 is to be mounted on the level adjuster mechanism 42, the adjuster plate 45 is horizontally adjusted by the adjuster bolts 48. The vessel-mounted plates 44 are positioned by the positioning blocks 46 and then fixed there. The process vessel 15 is made horizontal while further micro-adjusting the adjuster plate 45 by the adjuster bolts 48. This micro-adjusting of the adjuster plate 45 is carried out by overflowing pure water in the process vessel 15.

The straightening means 20 will be described with reference to FIGS. 7 to 9.

The straightening means 20 is arranged between the solution supply opening 17 and the wafers W to uniformly distribute a large amount of washing solution 99 between the wafers W. The straightening plate 22 is made of quartz or fluoric resin and shaped rectangular. The diffusing plate 24 is made of quartz or fluoric resin and shaped circular. These and other parts of the straightening means 20 may be made of ceramics such as silicon nitride high in chemicals resistance.

Figure 7:
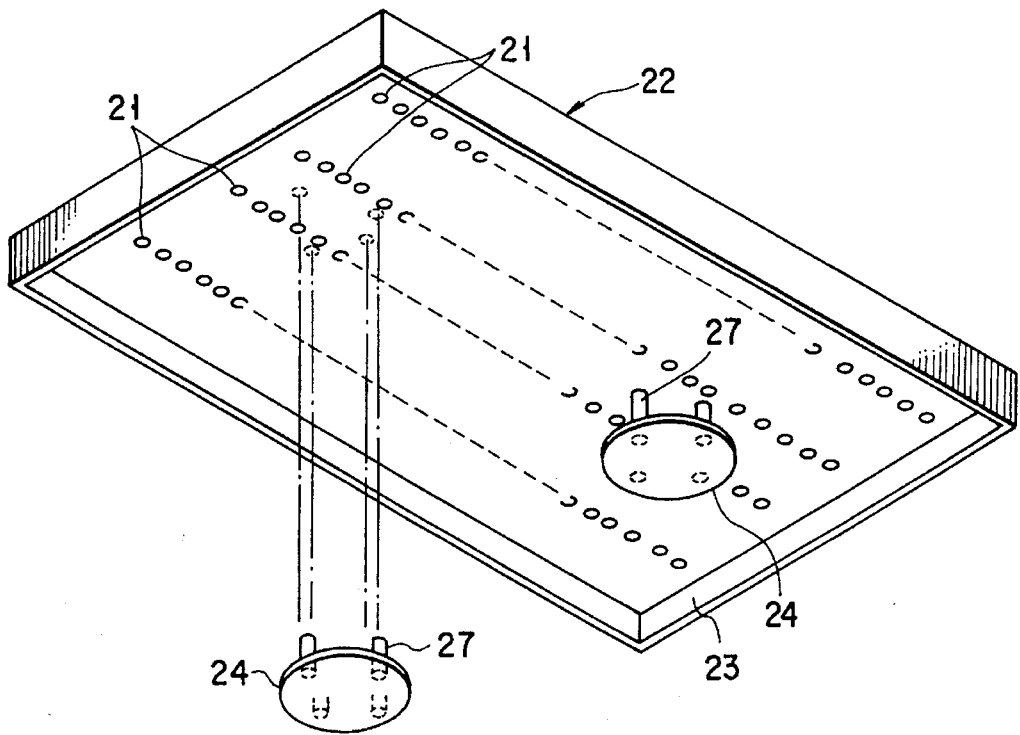
FIG. 7 is a perspective view showing straightening and diffusing plates dismantled.

As shown in FIG. 7, flow-preventing walls 23 are welded to four sides of the straightening plate 22, extending downward at right angle. Each wall 23 has a width of 10 to 50 mm and it is more preferably about 20 mm wide. Each diffusing plate 24 is attached to the under-side of the straightening plate 22 by four legs 27.

Figure 8:
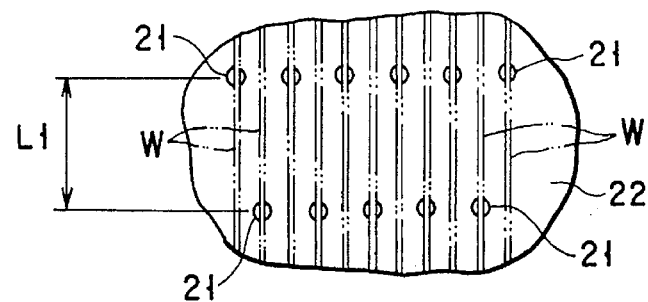
FIG. 8 is a plan showing a part of the straightening plate enlarged.

As shown in FIG. 8, a plurality of apertures 21 are formed in the straightening plate 22. All of these apertures 21 have substantially same diameter and they form plural lines. More specifically, apertures 21 of one line are arranged just under even-numbered wafers W and apertures 21 of the other line just under uneven-numbered wafers W.

Figure 9:
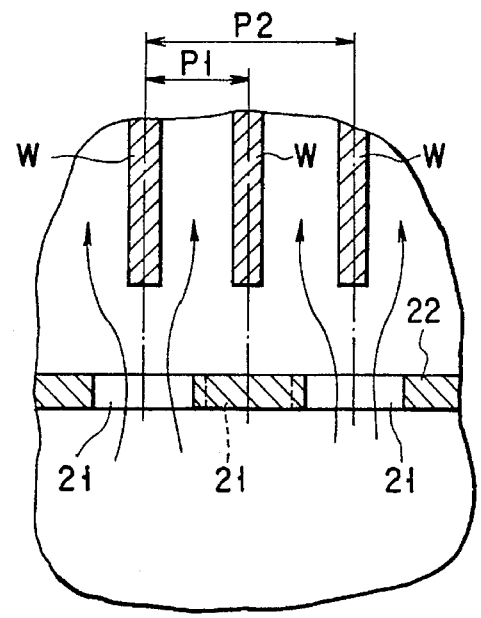
FIG. 9 is a vertically-sectioned view showing parts of the straightening plate and wafers enlarged.

As shown in FIG. 9, apertures 21 of one line are arranged just under those wafers W which are adjacent to each other with a wafer interposed between them. In short, aperture pitch $P_2$ is two times wafer pitch $P_1$. Each aperture 21 has a diameter of 5.6 mm and the total of apertures 21 which form four lines is 130 in this case. The pitch $P_1$ is 4.76 mm (wafer diameter 6 inches) or 6.35 mm (wafer diameter 8 inches) and the pitch $P_2$ is 9.52 mm (wafer diameter 6 inches) or 12.70 mm (wafer diameter 8 inches). It is desirable that the diameter of each aperture 21 is larger than the width of each wafer W. Aperture line interval $L_1$ is 10–50 mm and preferably smaller than the diameter of each wafer W.

Figure 10:
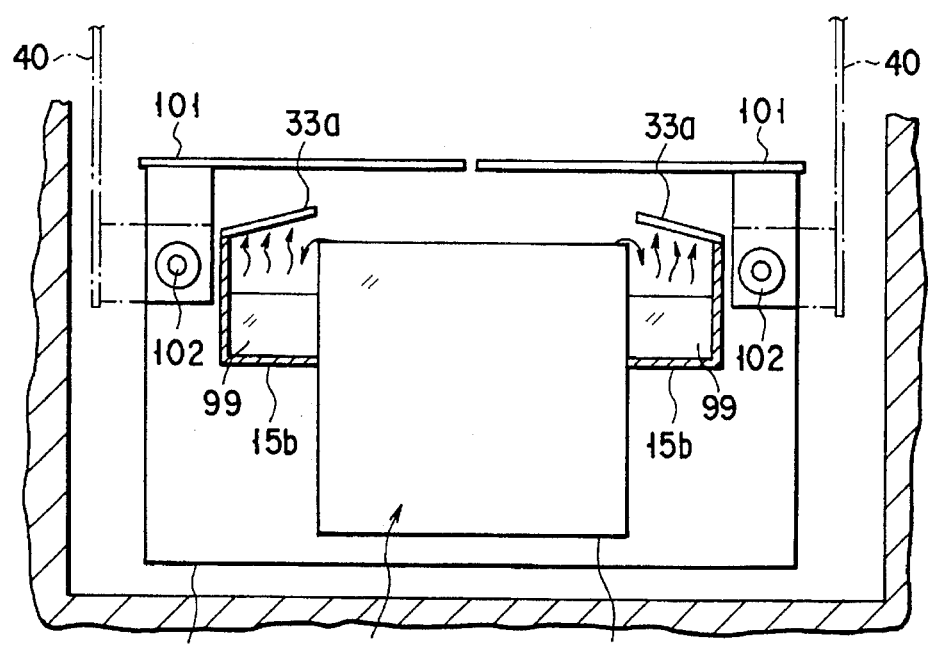
FIG. 10 shows the washing vessel, an outer vessel and an auto-cover.

The cover member 33a is attached to the overflow trough 15b of the process vessel 15, as shown in FIG. 10, and the evaporating and the heat radiating of process solution 99 are reduced by this cover member 33a. The cover member 33a is made of erosion-resistant material of the inorganic group such as quartz, resin of the fluorine group such as polytetrafluoroethylene, or resin of the polypropylene group, said fluorine and polypropylene resins being of the organic group. Autocovers 101 which can be opened wide are arranged on tops of right and left sides of an outer vessel 100 in which the process vessel 15 is housed. Each autocover 101 is attached to the main frame 40 by a rotary actuator 102.

Figure 11:
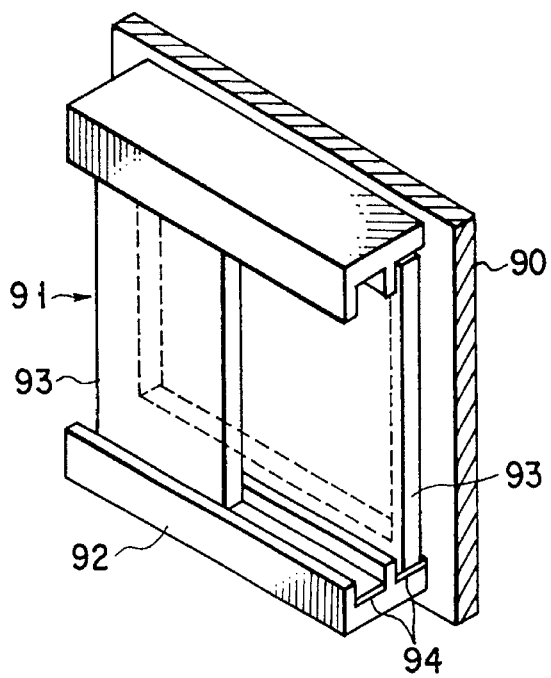
FIG. 11 is a perspective view showing a window attached to a partition wall for the substrates-washing apparatus.
Figure 12:
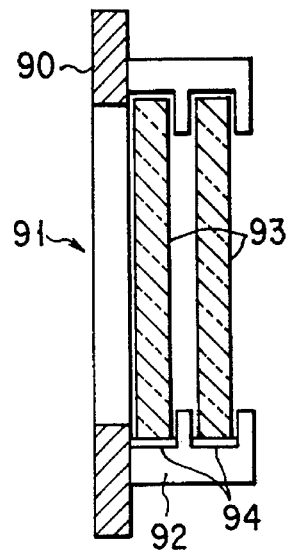
FIG. 12 is a vertically-sectioned view showing the window attached to the partition wall for the substrates-washing apparatus.

As shown in FIGS. 11 and 12, the substrates-washing apparatus is enclosed by partition walls 90. A window 91 is attached to one of the partition walls 90. Slide doors 93 are seated on a sill of the window 91. A tape 94 made of resin of the fluorine group such as polytetrafluoroethylene, which has excellent slide-enhancing characteristic, is bonded to each of grooves in the sill 92 in which the slide doors 93 are seated. It may be bonded to the sliding portions of the slide doors 93. The partition walls 90 are made of resin such as vinyl chloride. The slide doors 93 are made of one of resins of the vinyl chloride and acryl group which are excellent in transparence.

Figure 13:
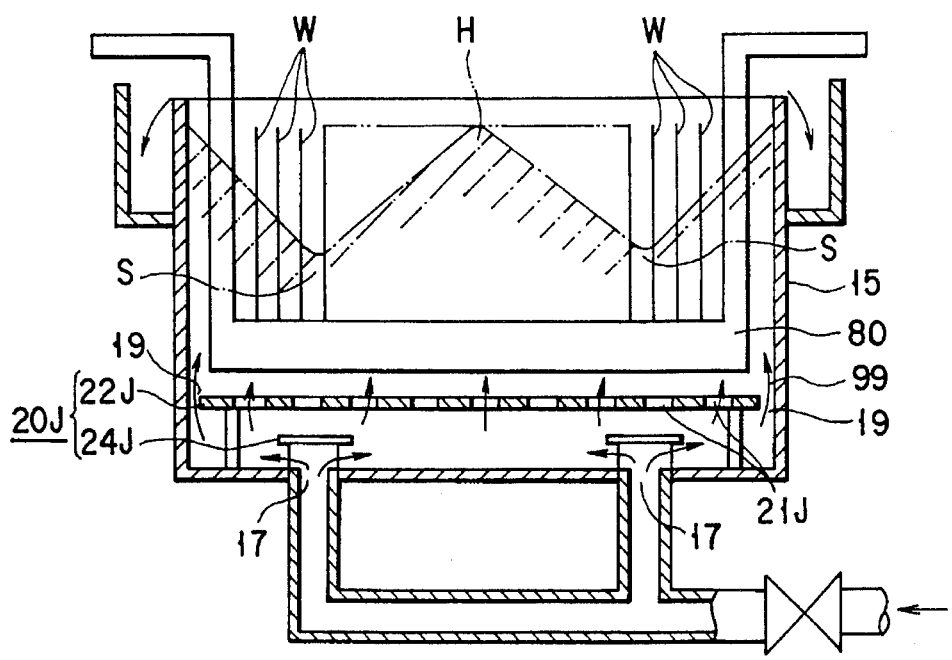
FIG. 13 is a vertically-sectioned view showing the conventional substrates-washing apparatus as a type.

The conventional substrates-washing apparatus will be described at first referring to FIG. 13. This will be helpful to distinguish the substrates-washing apparatus according to the present invention from the conventional one.

Apertures 21J are formed substantially like a lattice in a straightening plate 22J which is a part of straightening means 20J. In short, apertures 21J in each line area arranged just under all of the wafers W.

However, the straightening plate 22J is made of quartz which is smaller in processing accuracy than metal. The straightening plate 22J is therefore arranged in the vessel 15 in such a away that each of its side rims has a clearance 19 of about 1 mm relative to the side wall of the vessel 15. Washing solution 99 therefore flows faster through the clearances 19 than through the apertures 21J. Turbulent flow is thus caused. This makes the flow of washing solution 99 uneven in the vessel 15.

Further, the flow velocity of washing solution 99 becomes smaller at those areas S which are just above diffusing plates 24J than at other area in the vessel 15. The amount of washing solution 99 flowing into the areas S, therefore, becomes smaller than that of washing solution 99 flowing into an area H in the vessel 15 under which no diffusing plate 24J is arranged. Those wafers W which are in the areas S are not washed to a desired extent and the washing of 50 sheets of wafers W is not uniform accordingly. This makes the wafers-washing efficiency lower and a larger amount of pure water must be used to wash the wafers W at the final pure-water washing process if it is asked that the wafers W are washed to have a predetermined resistivity.

In the case of the substrates-washing apparatus according to the present invention, however, 50 sheets of wafers W on a boat 80 are carried into the process vessel 13b. Washing solution 99 is supplied into the process vessel 13b through the bottom opening 17 and overflowed from it through its open top. The wafers W are fully immersed into washing solution 99 in it. Washing solution 99 is distributed in all directions in it by the diffusing plates 24 and straightened to flow upward by the straightening plate 22.

As shown in FIG. 9, washing solution 99 flows along both surfaces of the left wafer W through the aperture 21 which is just under the left wafer W, and it also flows along both surfaces of the right wafer W through the aperture 21 which is just under the right wafer W. In the case of the center wafer W, washing solution 99 which is divided by the left and right wafers W while flowing in through the adjacent apertures 21 flows along both surfaces of the center wafer W. Washing solution 99 can be thus supplied along both surfaces of all wafers W in the vessel 13b.

Same thing can be said about all apertures 21 which form four lines in the straightening plate 22. In addition, no aperture is formed in that area of the straightening plate 22 just above which no wafer is held in the vessel 13b. This also enables washing solution 99 to fully flow in this area of the vessel in which the wafers W are held.

When the washing of the wafers W is finished in the vessel, the wafers W are carried into the next process vessel by the wafer chuck of the second carrier robot. They are water-washed in it in the same manner and their first water washing is thus finished. They are then carried into chemical and water solution vessels by the second carrier robot and washed in the same manner in these vessels. They are further carried from the water solution vessel into the drying vessel by the third carrier robot and dried in it by the vapor of IPA. When washed and dried in this manner, they are put into cassettes and carried to a next process section by the output buffer unit.

According to the present invention, the number of the apertures 21 in the straightening plate 22 is smaller and the apertures 21 have a same diameter. The forming of these apertures 21 in the straightening plate 22 can be thus made easier and the straightening plate 22 itself can be made lower in cost accordingly.

Further, the apertures 21 in the straightening plate 22 in such a way that they are positioned just under the even-numbered wafers W in one line and that they are positioned just under the uneven-numbered wafers W in the other line. In addition, they have a diameter larger than the width of each wafer W. This enables process solution to more smoothly flow along both surfaces of all wafers, thereby making the wafers-washing efficiency higher.

Furthermore, the flow-preventing wall 23 extends downward from four sides of the straightening plate 22. Washing solution 99 which flows to pass through the clearances 19 is thus prevented by the flow-preventing wall 23 and even if it can flow through the clearances 19 over the flow-preventing wall 23, its flow velocity is made lower. Its quantity which flows through the apertures 21 in the straightening plate 22 can be increased accordingly. In addition, its upward flow in that area of the vessel in which the wafers W are present cannot be disturbed by its flow which has passed through the clearances 19. Turbulent flow of it can be thus prevented.

The substrates-washing apparatus according to another embodiment of the present invention will be described with reference to FIGS. 14 through 17. For the sake of simplicity, any additional description will be omitted about same components as those of the above-described embodiment.

Figure 14:
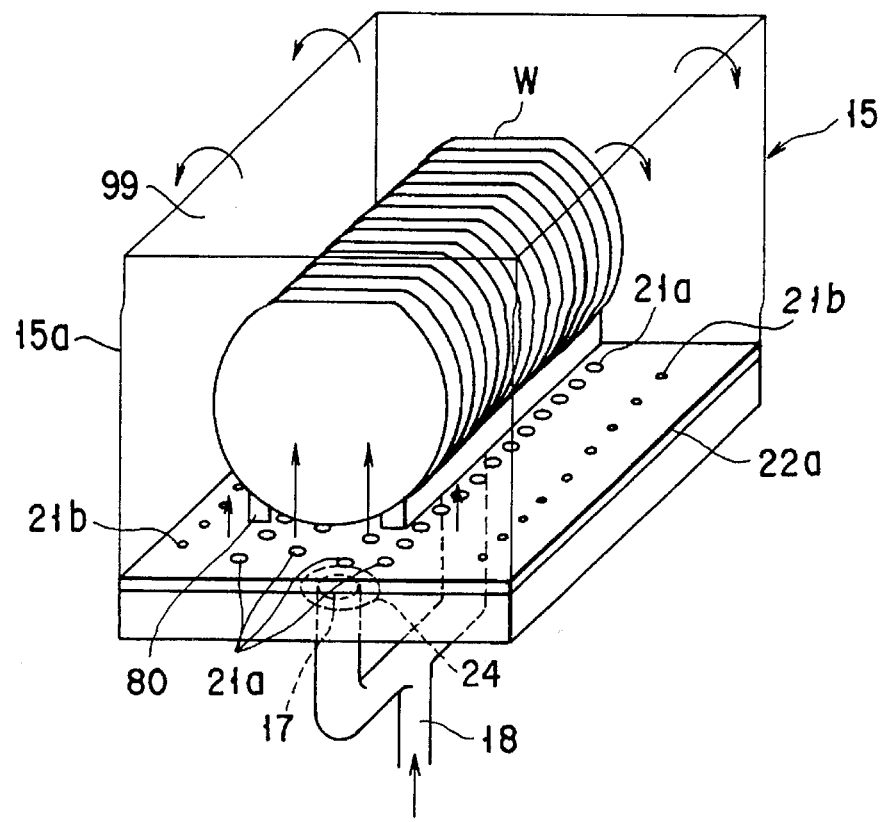
FIG. 14 is a perspective view showing a washing vessel in an another substrates-washing apparatus of the present invention as a type.
Figure 16:
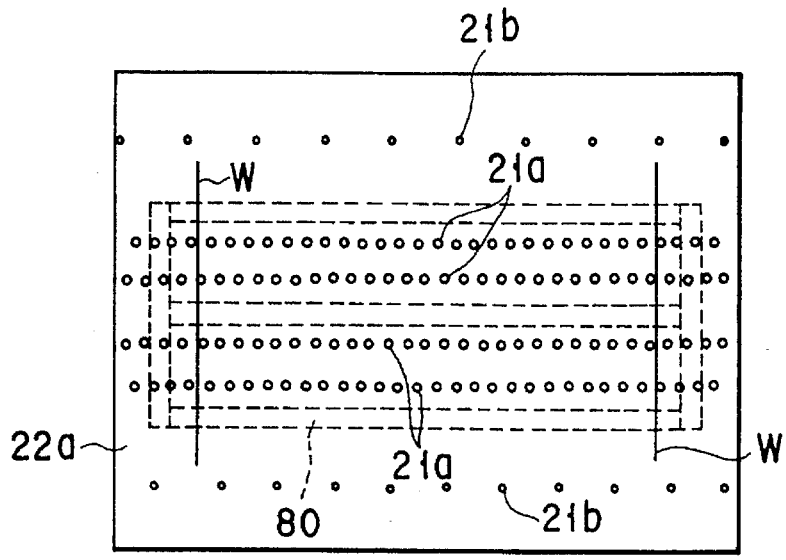
FIG. 16 is a plan showing a straightening plate made for a trial to check the washing capacity of the washing vessel.

As shown in FIGS. 14 and 16, two kinds of apertures 21a and 21b are formed in a straightening plate 22a. The first apertures 21a form four lines in the center portion of the straightening plate 22a in the longitudinal direction. The second apertures 21b form two lines in the straightening plate 22a along both side rims thereof. Each of the first apertures 21a has a diameter of 5.6 mm and each of the second ones 21b has a diameter of 3.4 mm.

The pitch interval of the first apertures 21a in each line is smaller than that of the second ones 21b in each line. The pitch interval between the lines of the first apertures 21a is smaller than that between the lines of the second apertures 21b. As seen in the case of the apertures 21 in FIG. 8, the apertures 21a in one line are shifted from those in the other line by half pitch. When 50 sheets of 6-inch wafers W are used, 130 units of the first apertures 21a are formed in the straightening plate 22a and 18 units of the second apertures 21b are formed in it in two lines.

Figure 15:
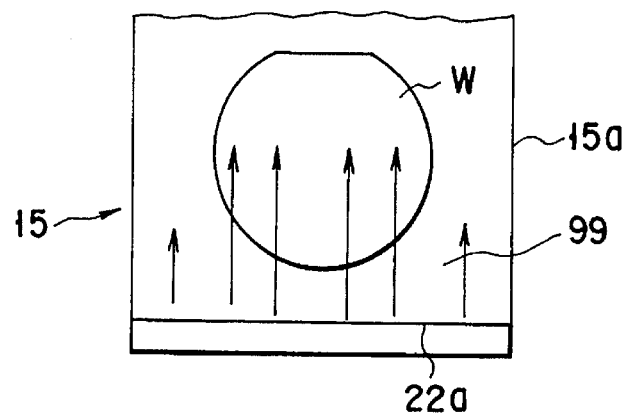
FIG. 15 shows the flow of washing solution in the washing vessel of the another substrates-washing apparatus.

According to this embodiment, the apertures 21b are formed in those areas of the straightening plate 22a in which no wafer is present. As shown in FIG. 15, therefore, sub-flows 98b of washing solution can be created on both sides of the wafers W together with a main center flow 98a. These sub-flows 98b prevent washing solution 99 from being stayed on both sides of the wafers W. The circulating efficiency of washing solution 99 can be thus enhanced.

Tests were conducted under the following conditions to check how the number and size of the apertures in the straightening plate were related to the effect of washing 50 sheets of 6-inch semiconductor in the process vessel by washing or process solution. Pure water to which hydrochloric acid was added was used as initial process solution. Pure water was supplied to this process solution and the time the process solution took to restore its resistivity to 15 MΩ.cm, which is the resistivity value of pure water, was checked. The wafers-washing efficiency was evaluated by checking this restoring time.

Test conditions

1. Process vessel: 320 mm long×238 mm wide×202 mm deep.
2. Resistivity value of pure water at the supply opening of the vessel: 17.3 MΩ.cm.
3. Velocity of pure water supplied: Refer to Tables 1 and 2.
4. Process solution: Pure water to which hydrochloric acid of about 18% was added by 1 cc.
5. Velocity of pure water supplied: Refer to Tables 1 and 2.
6. Number and diameter of first and second apertures in the straightening plate: Refer to Tables 1 and 2.
7. Conditions under which the resistivity value of process solution was measured:
    Measuring position; Adjacent to tops of semiconductor wafers.
    Measuring interval; Every 20-second since 60 seconds passed after the adding of hydrochloric acid. It was conducted until 780 seconds passed.

Twelve kinds of the straightening plates 22a were made having the first apertures 21a arranged in four lines under the wafers W and the second apertures 21b arranged in two lines outside both sides of the wafers W, as shown in FIG. 16. The first and second apertures 21a and 21b were different in their number and size every straightening plate 22a. The resistivity value of the process solution in the process vessel was intermittently measured while using the straightening plates 22a respectively. Results thus obtained about test examples 1 to 12 were shown in Table 1. As shown in Table 1, the resistivity value of the process solution reached 15 MΩ.cm for the shortest time period in the case of the test example 12. In other words, the wafers-washing efficiency was the best when the test example 12 was used. In the case of this test example 12, the first and second apertures 21a and 21b have same diameter of 5.6 mm and the number of them was 148 units, of which 130 units of the first apertures 21a were formed in four lines in the straightening plates 22a and 18 units of the second apertures 21b were formed in two lines in it.

From the test results obtained above, three kinds of the straightening plates 22a were further made. In the case of these straightening plates 22a, the number of the first and second apertures 21a and 21b was set 148 units, of which the first apertures 21a were totaled to 130 units and the second ones 21b to 18 units, and each of the first apertures 21a has a diameter of 5.6 mm but the second apertures 21b were different in their diameter. The resistivity value of the process solution was intermittently measured while using the straightening plates 22 respectively. Results thus obtained were shown in Table 2. As apparent from Table 2, the resistivity value of the process solution reached 15 MΩ.cm for the shortest time period when test example 14 was used. In the case of the test example 14, each of the second apertures 21b had a diameter of 3.4 mm. Further, the amount of pure water used in the case of test example 12 was compared with that in the case of test example 14. As the result, it was found that the amount of pure water used in the case of test example 14 or the straightening plate in the above-described second embodiment of the present invention was smaller than that in the case of text example 12. This leads to a conclusion that the above-described substrates-washing apparatus according to the second embodiment of the present invention has the highest wafers-washing efficiency.

TABLE 1

|  | Straightening Plate | 10 L/min. | 15 L/min. | 20 L/min. |
| --- | --- | --- | --- | --- |
| Test Example 1 | Diameter 2.8 × 196 Units | 16.00 | | |
| Test Example 2 | Diameter 2.8 × 164 Units | 16.40 | | |
| Test Example 3 | Diameter 2.8 × 148 Units | 16.00 | | |
| Test Example 4 | Diameter 3.4 × 196 Units | 11.60 | 9.00 | 6.60 |
| Test Example 5 | Diameter 3.4 × 164 Units | 11.30 | 8.60 | 5.60 |
| Test Example 6 | Diameter 3.4 × 148 Units | 12.60 | 9.30 | 6.30 |
| Test Example 7 | Diameter 4.0 × 196 Units | 13.60 | | |
| Test Example 8 | Diameter 4.0 × 164 Units | 12.60 | | |
| Test Example 9 | Diameter 4.0 × 148 Units | 12.60 | | |
| Test Example 10 | Diameter 5.6 × 196 Units | 17.30 | | |
| Test Example 11 | Diameter 5.6 × 164 Units | 11.30 | | |
| Test Example 12 | Diameter 5.6 × 148 Units | 10.30 | 7.00 | 5.60 |

TABLE 2

|  | Straightening Plate | 10 L/min. | 15 L/min. | 20 L/min. |
| --- | --- | --- | --- | --- |
| Test Example 13 | Diameter 2.8 × 18 Units | 10.00 | | |
| Test Example 14 | Diameter 3.4 × 18 Units | 9.60 | 7.30 | 5.30 |
| Test Example 15 | Diameter 4.0 × 18 Units | 11.30 | | |

Diameters and numbers of the second apertures 21b are shown in Tables 1 and 2 because only the second apertures change their diameters.

Figure 17:
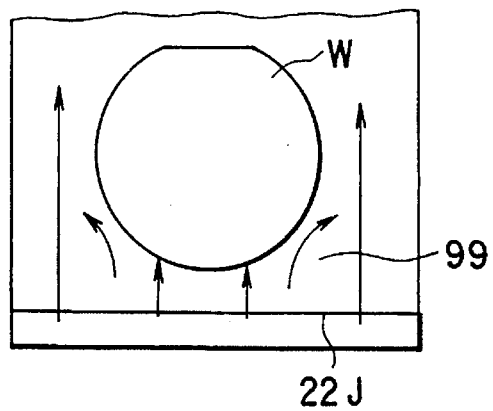
FIG. 17 shows the flow of washing solution in the washing vessel of the conventional substrates-washing apparatus.

As shown in FIG. 17, washing solution 99 flows more strongly in the center area of the straightening plate 22J than in both side areas thereof when this conventional straightening plate 22J is used.

It is preferable that the diameter of each of the first apertures 21a is larger than the width of each of the wafers W.

Although the semiconductor wafers W are washed in the above-described embodiments, the present invention can be applied to print and LCD substrates.

Other various process vessels in the substrates-washing apparatus according to further embodiments of the present invention will be described referring to FIGS. 18 through 24.

Figure 18:
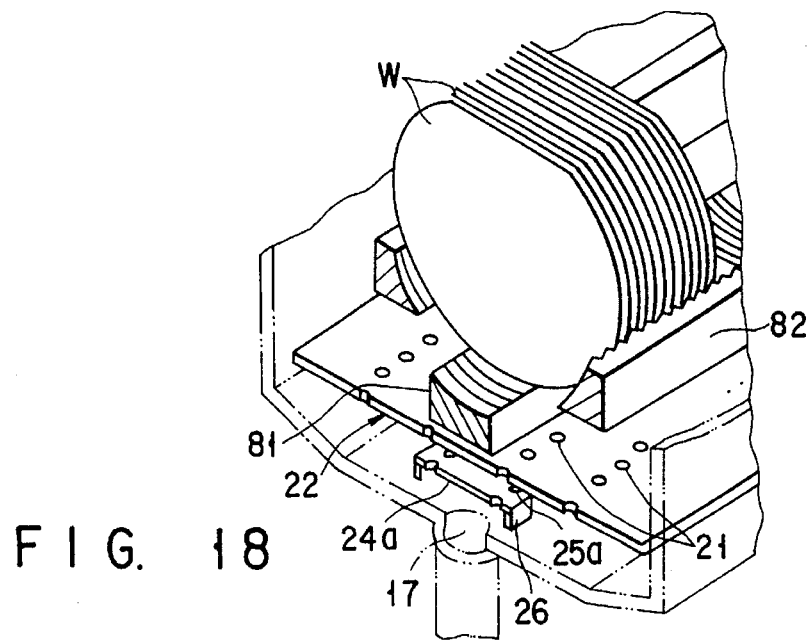
FIG. 18 is a perspective view showing a part of the inside of a further washing vessel according to the present invention.
Figure 19:
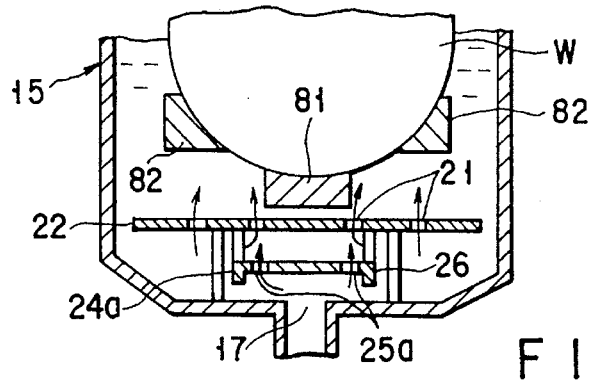
FIG. 19 is a vertically-sectioned view showing a part of the bottom portion of the washing vessel.

As shown in FIGS. 18 and 19, the chemical solution vessel 15 is shaped like a rectangle and it stores process solution such as hot ammonia water therein. Wafer holders 81 and 82 are arranged in it to hold 50 sheets of wafers W thereon. The straightening plate 22 is arranged under the wafer holders 81 and 82 and it is provided with a plurality of apertures 21. The supply pipe 18 is communicated with a process solution supply source (not shown) and also with supply openings 17 in the bottom of the vessel body 15a. Process solution is introduced into that area, which is just under the straightening plate 22 in the vessel 15, through these two supply openings 17.

A baffle plate 24a is arranged a little above each of the supply openings 17 and process solution is distributed to all over the straightening plate 22 through these baffle plates 24a. The wafer holders 81 and 82 are made of erosion-resistant and dust-repellent material such as quartz and PEEK.

Figure 20:
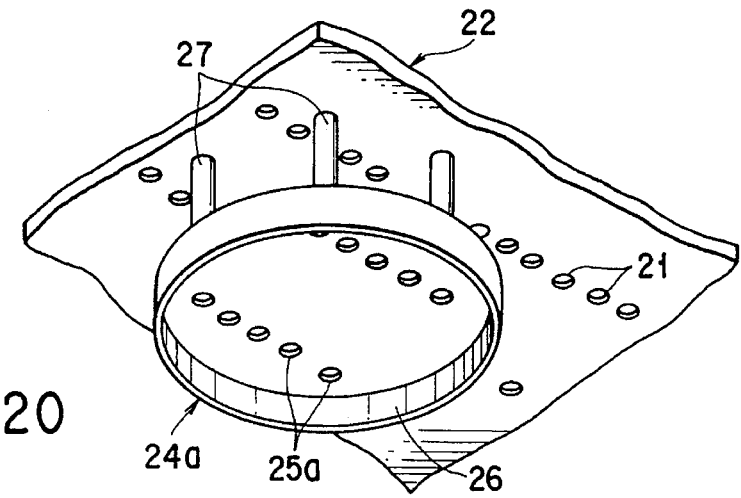
FIG. 20 is a perspective view showing another diffusing plate attached to the straightening plate.

As shown in FIG. 20, each of the baffle plates 24a is attached to the underside of the straightening plate 22 by four support rods 27 and it is provided with two lines of apertures 25a.

Figure 21:
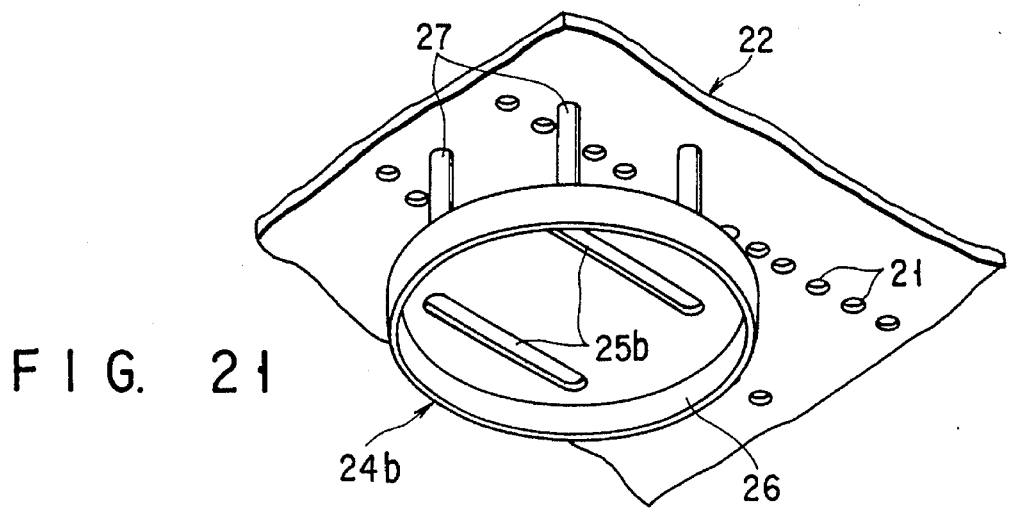
FIG. 21 is a perspective view showing a further diffusing plate attached to the straightening plate.

As shown in FIG. 21, each of baffle plates 24b attached to the underside of the straightening plate 22 by four support rods 27 may have two slots 25b.

Figure 22:
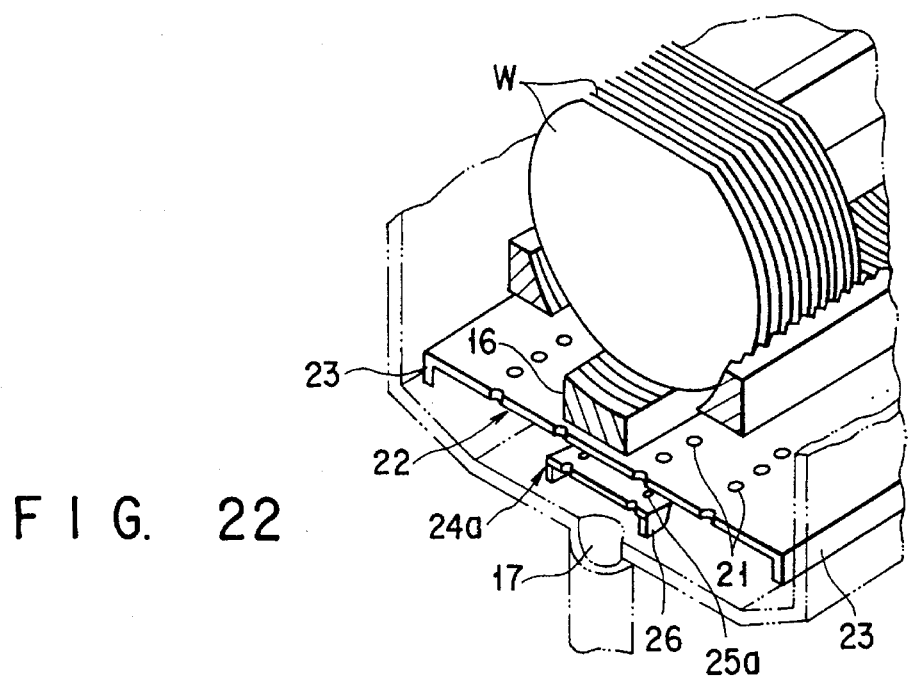
FIG. 22 is a perspective view showing a part of the inside of a still further washing vessel according to the present invention.
Figure 23:
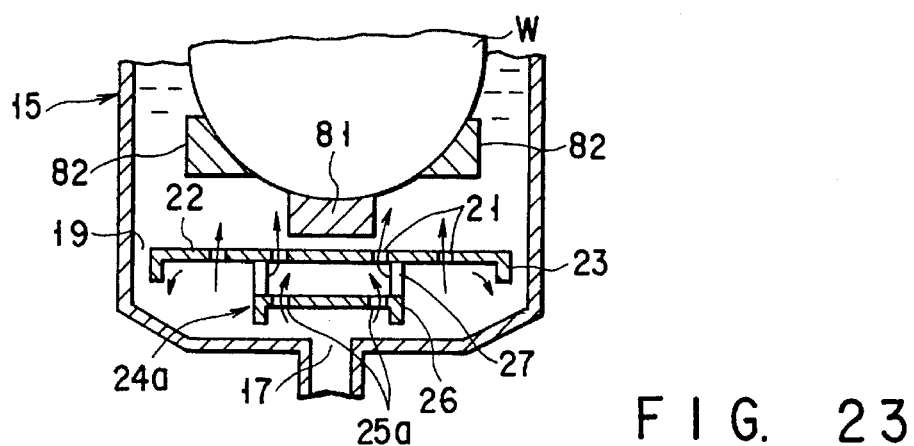
FIG. 23 is a vertically-sectioned view showing a part of the bottom portion of the washing vessel.

As shown in FIGS. 22 and 23, flow preventing walls may extend downward from four sides of the straightening plate 22 and also from those of each diffusing plate 24a. A part of washing solution 99 supplied into the vessel 15 through supply openings 17 can be introduced just above each diffusing plate 24a by the flow preventing wall 26 of the plate 24a. The flow of washing solution 99 between the wafers W which are above each diffusing plate 24a can be thus made uniform with the flow of washing solution 99 between the wafers W which are not above the diffusing plates 24a.

Figure 24:
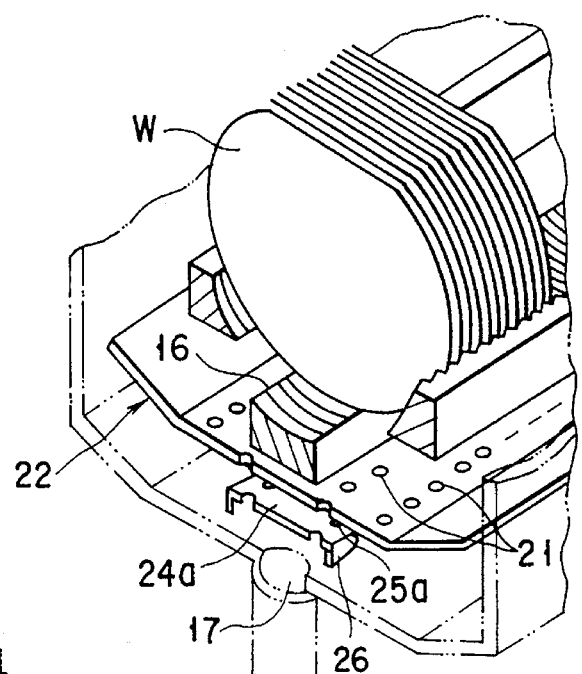
FIG. 24 is a perspective view showing a part of the inside of a still further washing vessel according to the present invention.

As shown in FIG. 24, the bottom of the process vessel 15 may be shaped to make the volume of the process vessel 15 smaller. It is preferable in this case that the straightening plate 22 is bent upward at both side portions thereof to match the shape of the vessel bottom and to form a substantially uniform solution-flowing area under the straightening plate 22.

A wafers-confirming unit 30 is arranged above the process vessel 15 to confirm whether or not the wafers W are correctly received and held on the wafer holders 81 and 82 when the wafers W are transferred from the wafer chucks to the wafer holders 81 and 82. This wafers-confirming unit 30 comprises a light-emitting section 31 which includes a light-emitting element attached to one wall of the process vessel 15, and a light-receiving section 32 which includes a light-receiving element attached to the other opposite wall of the process vessel 15. When some of the wafers W are not correctly held in the wafer-holding grooves of the wafer chucks or holders 81 and 82, they come out of the group of the correctly-held wafers to fall from the wafer chucks or holders, or they excessively tilt contact their adjacent correctly-held wafer. This can be prevented by the wafers-confirming unit 30.

Further embodiments of the present invention will be described with reference to FIGS. 25 through 28.

Figure 25:
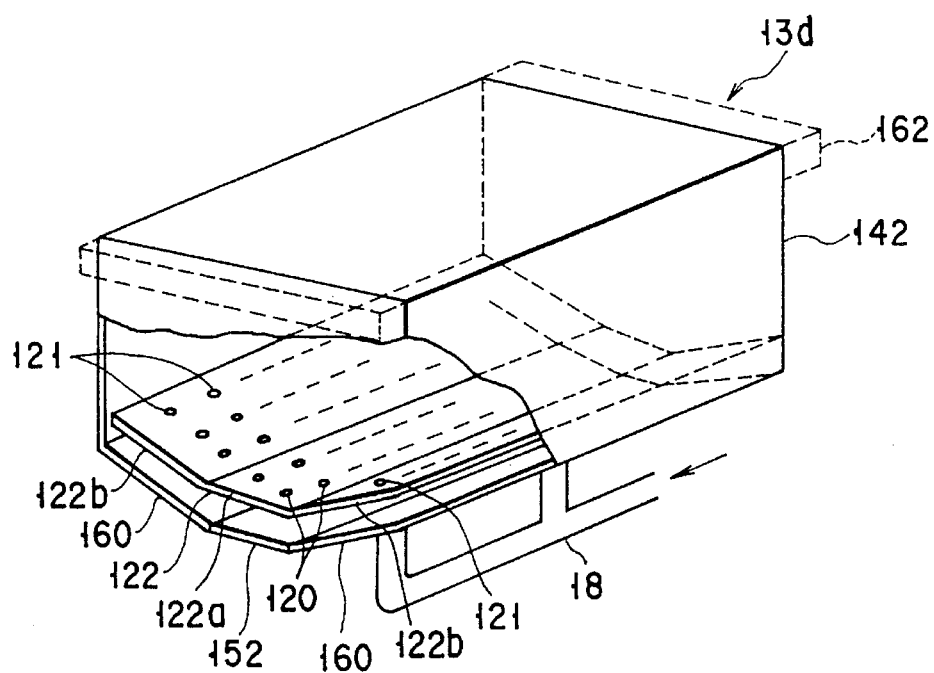
FIG. 25 is a vertically-sectioned view showing a part of the bottom portion of the washing vessel.

As shown in FIG. 25, a washing vessel 142 is arranged in a washing unit 13d and this washing vessel 42 has a smaller section area at its lower portion than at its upper portion.

Figure 26:
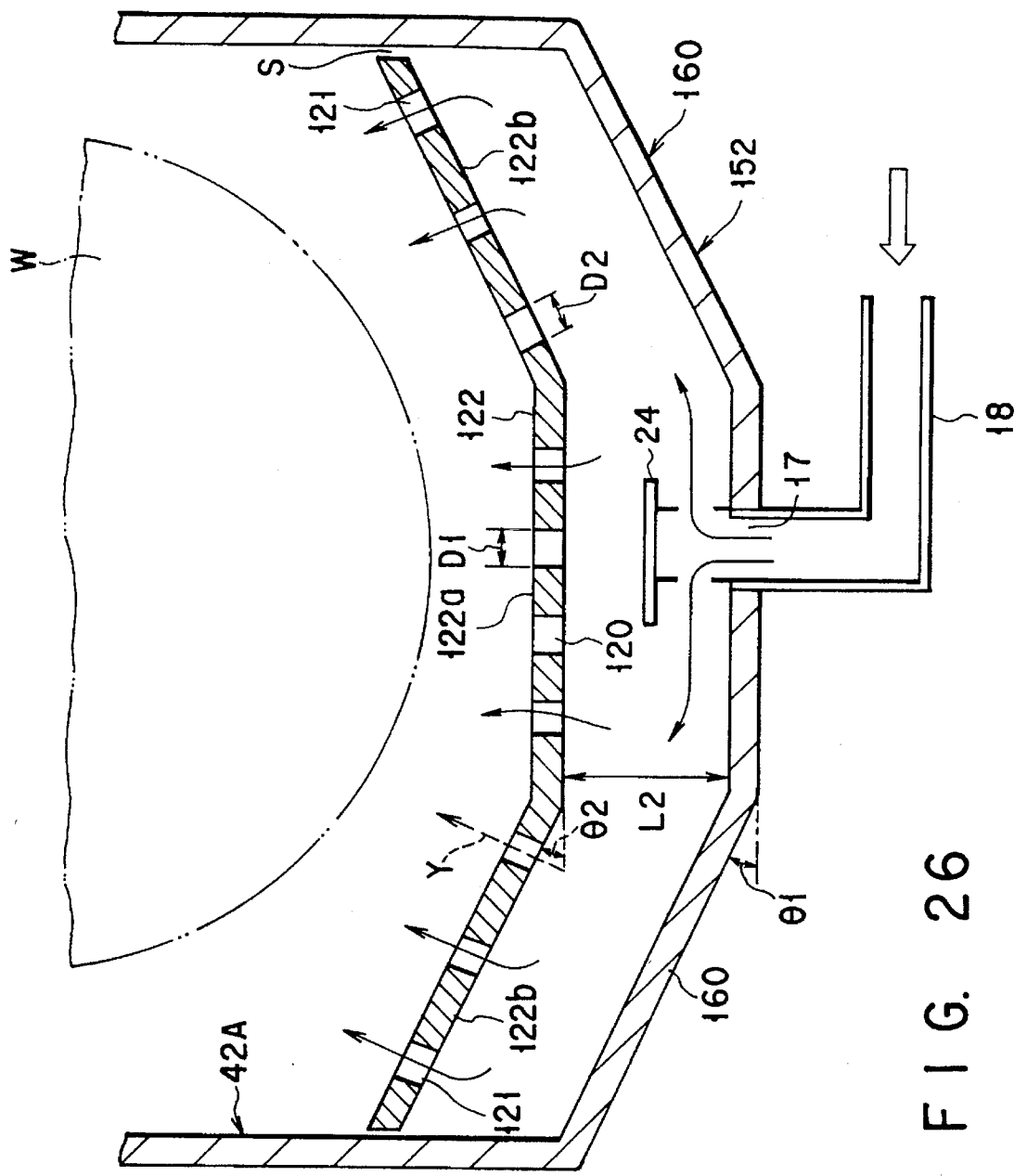
FIG. 26 is a perspective view showing a still further washing vessel according to the present invention.

As shown in FIG. 26, both side portions 160 of a vessel bottom 152 are bent upward having an angle of $\theta_1$ relative to a center horizontal portion 159 of the vessel bottom 152. The center horizontal portion 159 is optional and the vessel bottom 152 may be formed only by the tilted portions 160. A straightening plate 122 is arranged above the vessel bottom 152, separating from the bottom 152 by a distance $L_2$. The straightening plate 122 is shaped substantially to match the vessel bottom 152 and it is supported by four support rods 77 (not shown). The distance $L_2$ is in a range of 15 to 30 mm and more preferably 20 mm. Each tilted portion 122b of the straightening plate 122 has an angle $\theta_2$ relative to the center horizontal portion 122a thereof and these angle $\theta_1$ and $\theta_2$ are same and preferably 30 degrees.

Figure 27:
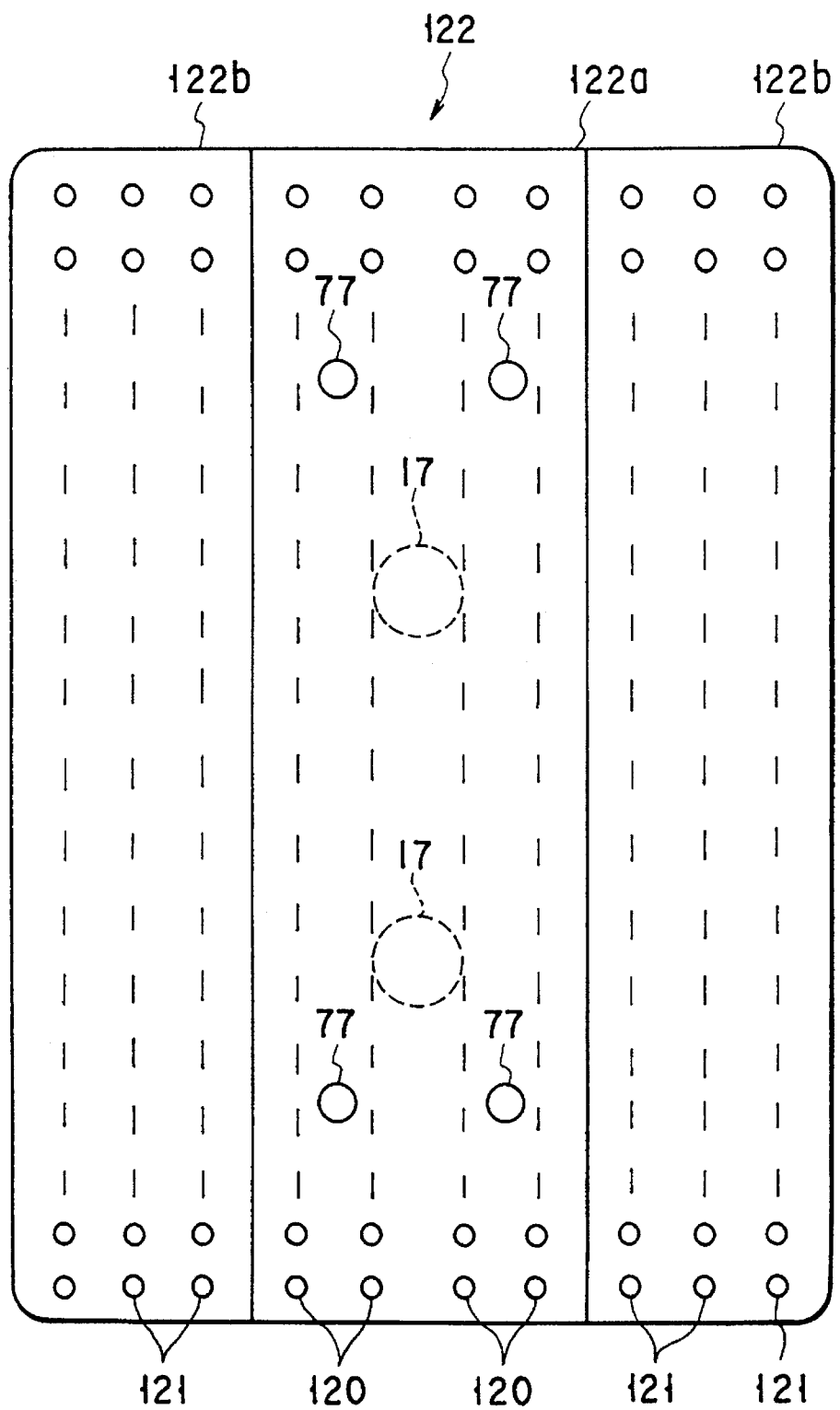
FIG. 27 is a plan showing a further straightening plate according to the present invention.

As shown in FIG. 27, four lines of apertures 120 are formed in the horizontal straightening portion 122a of the straightening plate 122 and they total to 31 units. Three lines of apertures 121 are formed in each tilted straightening portion 122b and they total to 11 units. Each of the first apertures 120 has a diameter D1 of 5.6 mm and each of the second apertures 121 has a diameter D2 of 3.4 mm. The rate of the total sectional area of the first apertures 120 in the horizontal portion 122a relative to the total sectional area of the second apertures 121 in each tilted portion 122b is therefore about 10:1.

When sulfuric acid or ammonia water having high reactivity is used in the washing apparatus, it is preferable that both of the washing vessel 142 and the straightening plate 122 are made of erosion-resistant quartz. When pure water is used, it is preferable that they are made of quartz or polyvinyl chloride.

It is also preferable that each of the second apertures 121 is formed in each tilted portion 122b to direct in a direction Y substantially perpendicular to the tilted portion 122b. Washing solution overflowing from the washing vessel 142 may be circulated, if necessary. When the wafers W are finally rinsed by pure water, the resistivity value of this pure water overflowing from the washing vessel 142 is measured.

Washing solution is supplied into the washing vessel 13d through the supply pipe 18. Washing solution thus supplied is distributed to all over the straightening plate 122 by the diffusing plates 24 which are arranged above two supply openings 17. When it reaches the straightening plate 122, it passes through the apertures 120 in the horizontal portion 122a and also through the apertures 121 in the tilted portions 122b. It flows upward like a laminar flow between the wafers W and particles can be thus removed from surfaces of the wafers W. When the wafers W are washed by chemical solution, solution overflowing from the vessel 142 is purified and then again circulated through the supply pipe 18. When they are washed by pure water, solution overflowing from the vessel 142 is not circulated but exhausted.

The bottom portion 152 of the washing vessel 142 is shaped as described above. The volume of the washing vessel itself, therefore, can be made smaller. The amount of chemical solution or pure water used can be thus reduced to a greater extent. In the case of this substrates-washing apparatus in which 8-inch wafers are washed, therefore, the volume of the apparatus can be reduced by 10%, as compared with the volume of the conventional apparatus.

The resistivity restoring characteristic of washing solution will be described, referring to FIG. 28 and comparing the above-described substrates-washing apparatus with the conventional one.

Figure 28:
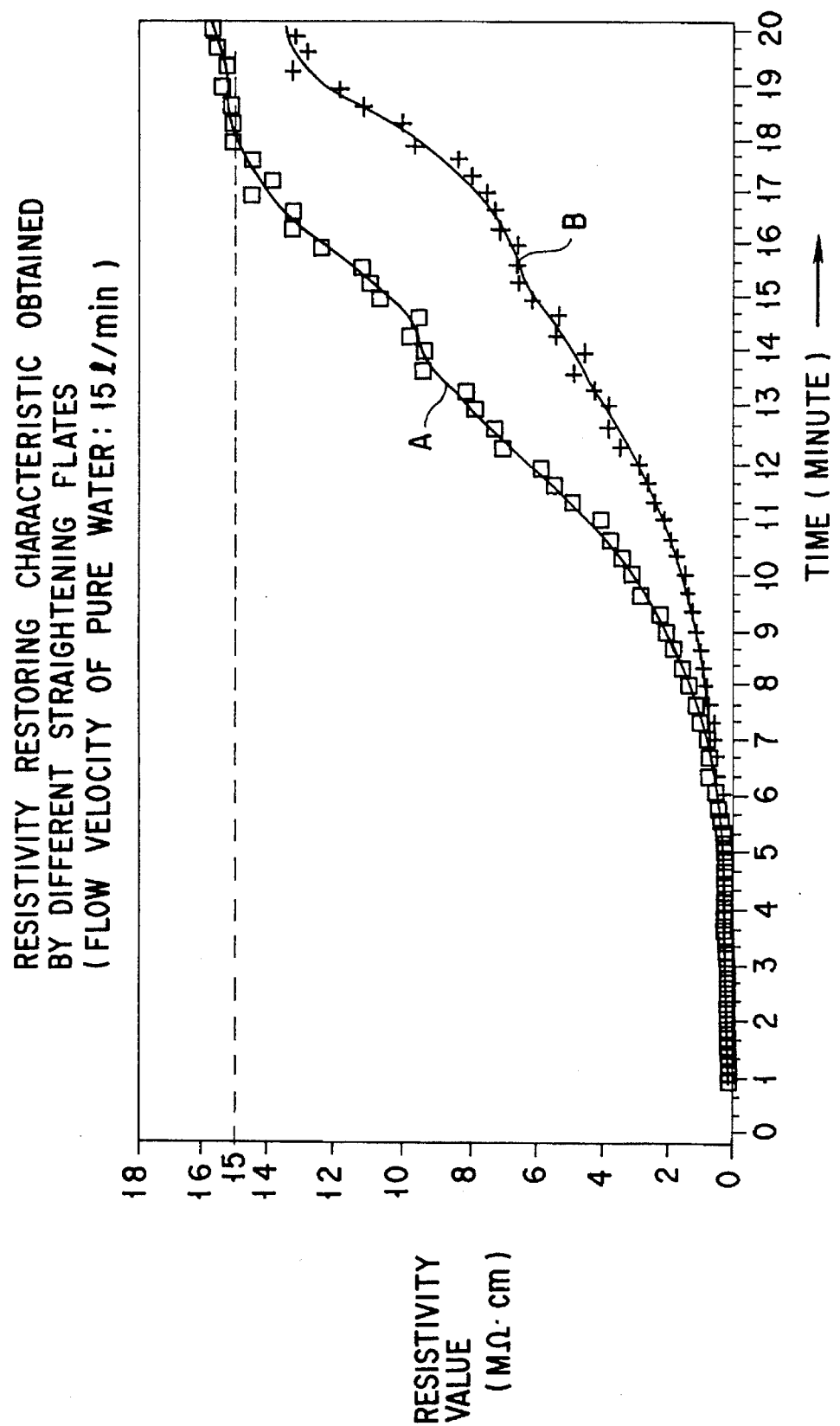
FIG. 28 is a graph showing how resistivity value changes when the wafers are being washed.

The washing vessel 142 is used and the resistivity restoring characteristic of washing solution attained by the washing vessel 142 is shown by a curve A in FIG. 28. The resistivity restoring characteristic of washing solution attained by the conventional vessel is shown by a curve B in FIG. 28. As apparent from FIG. 28, the time during which washing solution is replaced in the washing vessel 142 becomes shorter and the wafers-washing can be thus conducted with a higher efficiency. The resistivity value of washing solution overflowing from the washing vessel 142 is used to check what an extent the wafers W are washed. This value reaches the predetermined one or 15 MΩ.cm for a shorter time period in the case of the vessel 142 to thereby enable the wafers W to be washed with a higher efficiency. The resistivity value of 15 MΩ.cm represents that the final rising of the wafers W by pure water is finished, and it is apparent that the time during which the resistivity value of washing solution in the washing vessel 142 can reach 15 MΩ.cm is shorter, as compared with the conventional one.

When the diameter of each aperture 121 is made excessively large, most of washing solution is engulfed into the group of the wafers W and the wafers W are not correctly washed. Therefore, the rate of the total sectional area of the apertures 120 in the horizontal portion 122a relative to that of the apertures 121 in one of the tilted portions 122b is set preferably smaller than 30:1.

According to the above-described embodiment, the bottom portion of the washing vessel is tilted upward and the straightening plate is also tilted upward to match the shape of the vessel bottom. The volume of the washing vessel can be thus made smaller, causing no turbulent flow in washing solution while the wafers W are being washed in the washing vessel.

The amount of chemical solution or pure water used can also be reduced together with the running cost.

The wafers-washing speed can also be made higher because the time during which washing solution is replaced in the washing vessel becomes shorter. Particularly when the wafers W are washed by pure water, the resistivity restoring speed of washing water can be made higher.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A substrates-washing apparatus comprising:

a process vessel in which a washing solution is stored to wash a plurality of substrates;

means for holding the substrates parallel to one another in the process vessel;

solution supply openings formed in the bottom of the process vessel;

means communicated with the solution supply openings for supplying the washing solution into the process vessel through the solution supply openings; and a straightening plate arranged between the group of the substrates held on the holding means and the solution supply openings in the bottom of the process vessel, and provided with a plurality of apertures through which the washing solution passes, wherein the plurality of apertures form a first group arranged in a central area of said straightening plate and a second group arranged in a peripheral area of the straightening plate, wherein each of said first group of apertures is directly and vertically aligned with a respective substrate and said first group of apertures form plural lines in the longitudinal direction of the straightening plate, said first group of apertures in each line are substantially arranged to correspond to the substrates alternately, and said first group of apertures in one line are shifted from those in the other adjacent line.

2. The substrates-washing apparatus according to claim 1, wherein the pitch interval of the apertures in each line of the second group is larger than that of the apertures in each line of the first group.

3. The substrates-washing apparatus according to claim 1, wherein the apertures in each line of the first group have substantially same diameter and the apertures in each line of the second group also have substantially same diameter.

4. The substrates-washing apparatus according to claim 1, wherein the apertures in the lines of the first group form two lines in the center portion of the straightening plate and the apertures in the lines of the second group also form two lines along both side rims of the straightening plate and with the two lines of the first group interposed between them.

5. The substrates-washing apparatus according to claim 1, further comprising diffusing plates arranged between the straightening plate and the solution supply openings in the bottom of the process vessel to distribute the washing solution in all direction just under the straightening plate.

6. The substrates-washing apparatus according to claim 5, wherein said solution supply openings are two and the diffusing plates are arranged just above these two solution supply openings.

7. The substrates-washing apparatus according to claim 6, wherein each of the diffusing plates is provided with apertures through which the washing solution passes.

8. The substrates-washing apparatus according to claim 1, wherein the process vessel has a smaller sectional area at the lower portion thereof than at the upper portion thereof.

9. The substrates-washing apparatus according to claim 8, wherein the straightening plate is shaped to match the lower portion of the process vessel.

10. The substrates-washing apparatus according to claim 9, wherein the straightening plate has a horizontal center portion and upward-tilted side portions.

11. The substrates-washing apparatus according to claim 10, wherein the upward-tilted side portions of the straightening plate are made substantially parallel to the bottom of the process vessel.

12. The substrates-washing apparatus according to claim 1, further comprising flow-preventing walls extending downward from side rims of the rectangular straightening plate to reduce the amount of the washing solution flowing to side walls of the process vessel.

13. The substrates-washing apparatus according to claim 12, further comprising diffusing plates arranged between the straightening plate and solution supply openings in the bottom of the process vessel to distribute the washing solution in all directions just under the straightening plate.

14. The substrates-washing apparatus according to claim 13, wherein the solution supply openings are two and the diffusing plates are arranged just above these two solution supply openings.

15. The substrates-washing apparatus according to claim 14, wherein each of the diffusing plates has apertures through which the washing solution passes.

16. A substrate washing apparatus comprising:

a process vessel in which a washing solution is stored to wash even-numbered substrates and odd-numbered substrates;

means for holding the even-numbered and the odd-numbered substrates parallel to one another in the process vessel;

solution supply openings formed in the bottom of the process vessel;

means communicated with the solution supply openings to supply the washing solution into the process vessel through the solution supply openings; and a straightening plate arranged between the even-numbered and the odd-numbered substrates held on the holding means and the solution supply openings in the bottom of the process vessel, the straightening plate defining a first group of apertures positioned directly and vertically aligned with a respective one of the even-numbered substrates and a second group of apertures positioned directly and vertically aligned with a respective one of the odd-numbered substrates through both of which the washing solution passes, wherein the apertures under one substrate are positioned at a predetermined interval from one another, and the first group of apertures are shifted from the second group of apertures.

17. A substrate washing apparatus comprising:

a process vessel in which a washing solution is stored to wash even-numbered substrates and odd-numbered substrates;

means for holding the even-numbered and the odd-numbered substrates parallel to one another in the process vessel;

solution supply openings formed in the bottom of the process vessel;

means communicated with the solution supply openings to supply the washing solution into the process vessel through the solution supply openings; and a straightening plate arranged between the even-numbered and the odd-numbered substrates held on the holding means and the solution supply openings in the bottom of the process vessel, the straightening plate defining a first group of apertures positioned directly and vertically aligned with a respective one of the even-numbered substrates and a second group of apertures positioned directly and vertically aligned with a respective one of the odd-numbered substrates, wherein the washing solution passes through both groups of apertures and wherein a stream of the washing solution hits the bottom of the corresponding one of the substrates to wash the faces of the substrate as well as the adjacent face of the adjacent substrate.

18. A substrates-washing apparatus as claimed in claim 1, wherein the diameter of each of the apertures in the lines of the second group is smaller than that of each of the apertures in the lines of the first group.

* * * * *